United States Patent [19]

Klug et al.

[11] Patent Number: 5,190,431
[45] Date of Patent: Mar. 2, 1993

[54] SEPARATION AND TRANSFER APPARATUS

[75] Inventors: Mark W. Klug; Thomas E. Toth; Stephen R. Lamb; Steven D. Swendrowski, all of San Diego, Calif.; Kazuyuki Tsurishima; Mitsuaki Tani, both of Saitama, Japan

[73] Assignees: Sym-Tek Systems, Inc.; Advantest Corp.

[21] Appl. No.: 725,354

[22] Filed: Jul. 3, 1991

[51] Int. Cl.[5] .......................................... B65G 65/02
[52] U.S. Cl. .................... 414/417; 221/278; 414/786
[58] Field of Search ............... 414/403, 404, 417, 786; 221/278; 406/192

[56] References Cited

U.S. PATENT DOCUMENTS

| | | | |
|---|---|---|---|
| 2,570,070 | 10/1951 | Palmer | 414/417 |
| 4,000,798 | 1/1977 | Cedrone | 193/40 |
| 4,234,418 | 11/1980 | Boissicat | 209/542 |
| 4,370,011 | 1/1983 | Suzuki et al. | 439/264 |
| 4,618,305 | 10/1986 | Cedrone et al. | 414/403 |
| 4,629,387 | 12/1986 | Stillman et al. | 414/404 |
| 4,761,106 | 8/1988 | Brown et al. | 414/403 X |
| 4,775,279 | 10/1988 | Linker | 414/404 X |
| 4,776,747 | 10/1988 | Swapp et al. | 414/417 |
| 4,836,797 | 6/1989 | Riechelmann | 439/264 |
| 4,906,162 | 3/1990 | Long et al. | 414/403 X |
| 4,911,601 | 3/1990 | Muramatsu et al. | 414/417 |
| 4,926,118 | 5/1990 | O'Connor | 324/158 F |
| 4,941,795 | 7/1990 | Elliott et al. | 414/403 |
| 5,024,348 | 6/1991 | Kronseder | 414/417 X |

FOREIGN PATENT DOCUMENTS

88703 4/1987 Japan ..................... 414/403

Primary Examiner—David A. Bucci
Attorney, Agent, or Firm—Knobbe, Martens, Olson & Bear

[57] ABSTRACT

A separation and transfer apparatus for use in an electronic test system for testing electronic devices such as IC's, and the like. The apparatus has a housing for holding in a horizontal position, a magazine containing such electronic devices, an air blower for blowing compressed air at the electronic devices at an angle through a slit of the magazine so that the electronic devices are separated from one another and urged in a desired direction, a piston pin for insertion into a space developed between the last electronic device in the magazine and one end of the magazine, an advancing apparatus for changing the horizontal position of the air blower and the piston pin and for expelling the electronic devices from the magazine, and a controller for controlling the timing of the air blowing, the movement of the advancing apparatus, and the operation of the piston pin. The invention also includes a transfer apparatus having mounted thereon a second air blower and piston pin for transferring the electronic devices thus expelled from the magazine to the next stage of the test system, such as a temperature chamber. Another aspect of the present invention is a universal electronic device magazine for use in such separation and transfer apparatus, which magazine need not be changed or varied despite differences in the shape and kinds of the electronic devices to be tested.

12 Claims, 5 Drawing Sheets

DIP

MGN 1

FIG. 8b

SOJ

MGN 2

FIG. 8c

ZIP

MGN 3

FIG. 8d

PLCC

MGN 4

SEPARATION AND TRANSFER APPARATUS

FIELD OF THE INVENTION

This invention relates to a separation and transfer apparatus for small articles, and more particularly, to a separation and transfer apparatus for use in an electronic device test system. The apparatus separates electronic devices from a carrier magazine and transfers them, without utilizing the weight of the devices, along a horizontal plane to the next position in the test process.

BACKGROUND OF THE INVENTION

Modern electronics devices, such as integrated circuits ("ICs") or semiconductor "chips" are rapidly increasing in production quantity and functionality, while decreasing in size and unit cost. For increasing productivity of the electronic devices, it is required to decrease test cost and test time. This can best be accomplished with fully automated electronic device test systems.

In a conventional test system, electronic devices to be tested are removed from their container, usually called a "magazine," and separated from one another by the force of gravity. That is, the electronic device to be tested is positioned initially at a vertically higher position than the test head and, by its own weight, is separated from the other devices such that it slidably descends to the test head. After the test, the electronic device descends further, due to gravity, to a lower position than the test head so as to be sorted depending on the test results.

Such conventional device test systems, which utilize the force of gravity to separate and transfer the electronic devices, has two inherent disadvantages. First, since modern electronic devices have become smaller and lighter than before, an individual electronic device does not have sufficient weight to efficiently separate from the others. This causes "jamming," wherein two or more electronic devices stick together and cannot separate from one another. If such jamming occurs, it is usually necessary to stop the operation of the test system to clear the jam, thus causing a serious loss of time and efficiency. Furthermore, the risk of jamming is greatly increased due to the configuration of the new types of electronic devices to be tested. For example, one new type of electronic device has electric leads (pins), not just on two sides of the chip package (as in the conventional dual-in-line or "DIP" package), but on all sides of the package. Thus, a plastic-chip-carrier ("PLCC") package has electric leads on all four sides of the package, thus inherently causing the pins to contact one another and increasing the likelihood of jamming.

Second, to avoid the jamming, the outer surface of the electronic device must be made sufficiently smooth so as not to cause any friction or entanglement with other devices. However, this is also impractical since the plastic molded packages of the devices inevitably have some burrs remaining from the production process. It is not economically practical to completely eliminate such burrs. Therefore, the electronic device test systems which rely on the force of gravity for device separation and transfer suffer from a few serious disadvantages in view of modern techniques in electronic device packaging.

A further inefficiency in the testing of electronic devices involves the carrier in which the devices are placed prior to testing. Today, many different types of electronic devices are being utilized; whereas, in previous years, only the standard DIP package was commonly utilized. Electronic devices to be tested are usually put into market in a container called a device magazine or an IC magazine. Therefore, in testing electronic devices with typical test systems, it is necessary to take the electronic devices to be tested out of the device magazine prior to testing, and then replace them for shipping. In the conventional device magazine, the outer shape and size varies depending on the kind and shape of the electronic devices to be contained therein. If the device magazine must be changed each time a differently configured chip is tested, a serious increase in production time and expense will result.

Thus, there is a need for a more versatile electronic test system which can efficiently transfer electronic devices without relying on the force of gravity and, at the same time, accommodate a variety of chip configurations.

SUMMARY OF THE INVENTION

The separation and transfer apparatus of the present invention utilizes an air jet and an air powered pin to efficiently and accurately transfer electronic devices along a horizontal plane, thus eliminating the disadvantageous use of gravity as a transfer mechanism. Furthermore, the present invention comprises a universal magazine which can accommodate an endless variety of chip configurations, both presently existing and yet to be developed. It should be noted, however, that the separation and transfer apparatus of the present invention is not limited to an application in the field of testing electronic devices, but can also be applied to other small articles.

The separation and transfer apparatus of the present invention is adapted to be incorporated into a typical electronic test system such that the device magazine is mounted in a horizontal manner for electronic device removal, preferably in a one-by-one manner. However, the devices can be removed at any rate such as two by two, all at once, or any other manner desired. The magazine is mounted in the test system such that the floor on which the electronic devices rest is in the same horizontal plane as the floor of the test system surface over which the electronic devices are to be transferred. This coplanar, horizontal arrangement minimizes the handling of the devices that is necessary and facilitates their transfer. Furthermore, the universal magazine of the present invention insures that chips of various configurations and package sizes can be accommodated without the need for stopping the test in order to change the magazine or its mounting apparatus.

This horizontal, coplanar arrangement also permits the transfer of electronic devices to be very accurately and precisely controlled, which is virtually impossible to do with gravity powered transfer mechanisms. In other words, the weight, whether it be small or great, and the momentum of the falling device, both of which frequently lead to jamming, are not problematic factors under the present configuration.

The separation and transfer apparatus of the present invention comprises three important components: an advancing apparatus, a transfer apparatus, and a controller for coordinating the movement and timing of the advancing and transfer apparatus. Each of these apparatus includes a separation feature which utilizes an air jet or air nozzle for separating the electronic devices at the appropriate location. Each apparatus also comprises an air-powered piston or pin for advancing and transferring the electronic devices strategically along the test course in the manner desired. Essentially, the piston pin simply "pushes" the electronic device in the desired direction of travel. As explained above, this pushing feature allows the device to be much more accurately controlled than with gravity-fed test systems.

The advancing apparatus and transfer apparatus also comprise an associated drive mechanism or driver for imparting motion to each apparatus in order to, respectively, advance and transfer electronic devices. Preferably, in the case of the advancing apparatus, the driver is comprised of an endless belt driven on a pair of pulleys powered by an electrical step motor. In the case of the transfer apparatus, the driver is preferably an air-powered device which imparts motion to the apparatus in a slidable manner along a guide rail. However, many other types of drive mechanisms are within the scope of the present invention.

By way of more detailed explanation, and in accordance with the method of the present invention, the advancing apparatus causes the electronic devices to be tested to advance one by one out of the magazine for transfer to the testing location. The separation feature of the advancing apparatus produces a gap which permits the apparatus to be initialized at one end of the magazine. That is, when the magazine is loaded into the test system, it is full of electronic devices, and there is no space or gap into which a transfer pin can be inserted. A typical chip magazine has an "open" and a "closed" end, the former permitting the chips to be removed for test purposes and the latter preventing the chips from falling out of the magazine. In accordance with the separation feature of this advancing apparatus, the air nozzle of the apparatus blows a continuous stream of air through a bottom slit in the magazine while the apparatus continually moves from the open end of the magazine toward the closed end. As the apparatus moves, the electronic devices are shifted slightly toward the open end. This produces a gap near the closed end into which a transfer piston can be inserted. The advancing apparatus is now initialized and ready to advance the electronic devices one by one as they are transferred to the test location.

The transfer apparatus also includes a separation feature which produces a gap between the first electronic device to leave the magazine through its open end and the second device to so leave. This gap allows the transfer apparatus to insert a piston pin so that the first electronic device can be pushed to the next desired location in the test process. Thereafter, the transfer apparatus returns to its initial location and its associated air nozzle produces a gap between the second and third electronic devices so that the piston transfer pin can be inserted therein. The second electronic device is then transferred for testing purposes. As the transfer apparatus pushes each device to the next location, the advancing apparatus moves up one step, causing another electronic device to be expelled from the magazine. This process continues until all of the electronic devices have been advanced, expelled, and transferred to the next location.

This coordination of movement between the transfer apparatus and advancing apparatus is orchestrated by the controller, which preferably takes the form of a computer program and microprocessor which together generate electronic signals to the respective drivers of the two apparatus. Thus, the controller causes the advancing apparatus to move step by step as each electronic device is expelled from the magazine and transferred to the next location by the transfer apparatus. The controller also coordinates the movements of the air nozzle and piston pin, the latter of which is also, preferably, air powered. The accuracy of the expulsion and transfer steps is further enhanced by the use of a temporary holding mechanism or spring plate which prevents the second electronic device to leave the magazine to be moved or otherwise displaced while the first electronic device is being transferred to the next location.

An important feature of the present invention is a universal magazine which permits chips of all configurations and package types to be handled. As with conventional magazines, a longitudinal slit is found on one side thereof in order to provide access to the electronic devices by the air nozzle and piston pins for separation and advancing purposes. The universal magazine is comprised of a uniform outer shape including identical height, width, and length dimensions, regardless of the differences in configuration of electronic devices contained therein. Furthermore, as mentioned above, each magazine has an identical floor thickness and location such that, when the magazine is mounted in the electronic test system, the floor of the magazine is in the same plane as the floor of the test system over which the electronic devices are to be transferred.

Thus, the separation and transfer device of the present invention overcomes the problems associated with gravity-fed, conventional test systems of the prior art by providing precise control and movement along a horizontal plane.

DETAILED DESCRIPTION OF THE INVENTION

Figure 1:
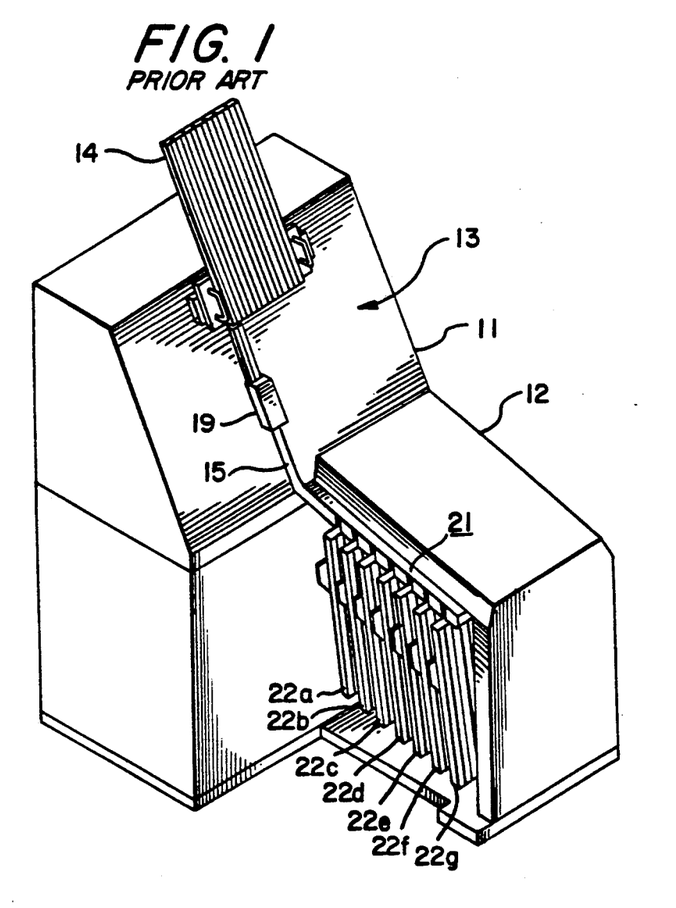
FIG. 1 is a perspective view of a conventional electronic device test system utilizing the force of gravity to transfer the electronic devices to be tested.

The conventional type of electronic device test system is illustrated in FIG. 1. In the case of FIG. 1, the test system is similar to Model T390/27 manufactured by Advantest Corp. The test system has a main casing 11 having housed therein a measuring instrument (not shown) and an auxiliary casing 12 projecting forwardly from the lower half portion of the main casing 11. The upper half portion of the front of the main casing 11 slopes down to the auxiliary casing 12 as indicated by the sloped portion 13. On the sloped portion 13 is mounted a top magazine rack 14, in which a number of electronic devices (in this example, "IC" devices) to be tested are housed in IC magazines. A rail 15 is mounted on the sloped portion 13 to extend down from the lower end of one side of the magazine rack 14.

Figure 2:
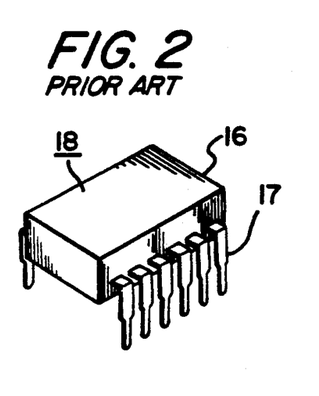
FIG. 2 is a perspective view of a typical electronic device to be tested with the test system.

In this conventional type of test system, an IC device 18 slides down the rail 15 from the top magazine rack 14. Referring to FIG. 2, there is shown a typical electronic device 18 to be tested of the type which slides down the rail 15. The IC device 18, as illustrated in FIG. 2, is of the dual-in-line type package or "DIP" package having terminal pins or electric leads 17 projecting out from either side of the body 16. At the middle of the rail 15 there is provided a test head or measuring part 19, in which a contact drive assembly is disposed, by which terminal pins 17 of an IC device located in the measuring part 19 are connected to the measuring instrument placed in the main casing 11 for conducting various measurements and tests. After being measured, the IC device slides down the rail 15 from the measuring part 19 to a sorting part 21 in the auxiliary casing 12 and is sorted according to the test results and sent to any one of a plurality of bottom magazine racks 22a to 22g mounted on one side of the auxiliary casing 12.

Figure 3:
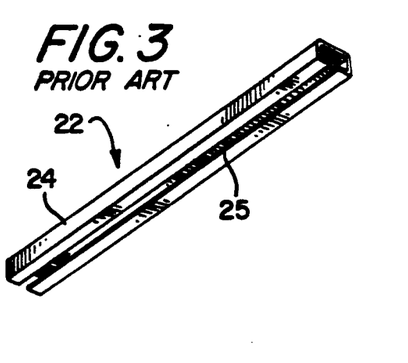
FIG. 3 is a perspective view of a typical magazine for containing electronic devices prior to and after testing.

FIG. 3 shows an example of an IC magazine widely used in the electronics industry. A magazine 22 is used for storing electronic devices therein and has a body 24 and a slit 25. The slit 25 is used, for example, to visually acknowledge the contents in the magazine 22 or to clear a jam of electronic devices n the magazine 22. The electronic device magazine 22 is usually made from plastic or aluminum material.

In the conventional electronic device test system of FIG. 1, to transfer an electric device to be tested from one place to another, the weight or gravity force of the electronic device itself is utilized. For example, an electronic device, such as an IC or semiconductor chip to be tested, separates from the other devices in the device magazine 22 and slides down on the rail 15 to the measuring part 19, due solely to the force of gravity. After the test, the electronic device further slides down on the rail 15 to the sorting part 21. As explained above, there are a number of disadvantages in such conventional device test systems which utilize gravity as a force to separate and transfer the electronic devices to be tested.

FIGS. 4a-d shows a series of schematic diagrams for explaining the operation of the electronic device separation and transfer apparatus of the present invention. The movement of the electronic device to be tested in the present invention is generally in the horizontal direction since the present invention does not utilize the gravity force of the electronic device to be tested. In the present invention, the electronic devices to be tested are taken out from a device magazine and separated one by one so that they can be transferred to the next stage of the test system; however, the principles of the invention apply equally well to other types of separation and transfer movement.

In FIGS. 4a-d, an electronic device magazine 22 having a plurality of electronic devices 20, such as ICs, is placed in a horizontal position. As will be explained below in more detail in connection with FIG. 5, the magazine 22 is placed within the housing of a test system so that the ICs can be expelled from the magazine and transferred to a test location. Although the present invention is described in connection with a traditional DIP package, other chip package configurations are equally compatible with the principles of the present invention. In the device magazine 22, there is provided a stopper 27 at one end and an opening 28 at the other end. The purpose of the stopper is to prevent the electronic devices from falling out of the magazine. There is also provided an advancing apparatus 32 and a transfer apparatus 34, each of which has an air nozzle and a piston pin. The advancing apparatus 32 is positioned under the device magazine 22; whereas, the transfer apparatus 34 is positioned on the upper side of the magazine near the opening 28, in upside down relation to advancing apparatus 32. The advancing and transfer apparatus 32 and 34 are almost identical with each other except for the structure of the air blower nozzles. The details of these apparatus will be explained later in connection with FIGS. 6 and 7.

FIGS. 4a-4d show the operational principles of the separation and transfer apparatus of the present invention. After setting the electronic device magazine 22, which is full of the electronic devices 20, in a horizontal position, the advancing apparatus 32 starts blowing air from the air nozzle 51 to each of the electronic devices 20 through a slit 25 in the electronic device magazine 22. While blowing air at the electronic devices 20, the advancing apparatus 32 continuously moves in parallel to the magazine 22, from a position close to the opening 28 to a position close to the stopper 27 of the magazine 22 (direction A in FIGS. 4a and 4b).

Figure 4A:
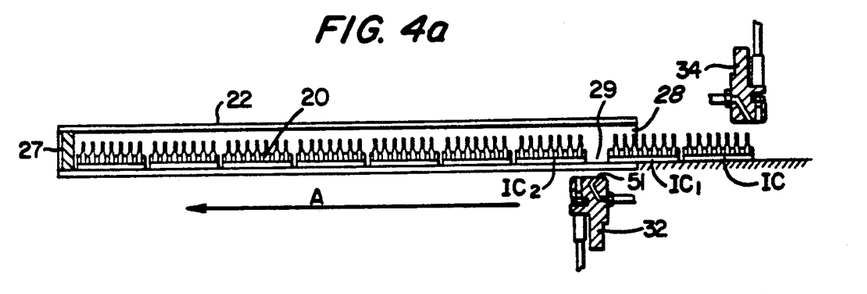
FIGS. 4a–4d are schematic illustrations showing the operational flow of the separation and transfer apparatus of the present invention.

Thus, referring first to FIG. 4a, the advancing apparatus 32 is shown in a position between $IC_1$ and $IC_2$. It should be noted that the first IC is, in reality, the last IC to be expelled from the previous magazine. $IC_1$ is waiting to be transferred to the next position in the test procedure as will be explained below in more detail. Thus, $IC_1$ is the first IC to be expelled from the magazine 22 shown in FIG. 4a.

By blowing the air at the electronic devices 20, as in FIG. 4a, the advancing apparatus 32 moves the electronic devices 20 one by one to the right hand side (the opposite direction to A) and causes a gap 29 between the electronic devices. Since the advancing apparatus 32 moves to the left side while blowing air at the electronic devices 20, the next electronic device 20 is transferred slightly to the right hand side. As a result, the gap 29 moves to the left hand side (direction A). Therefore, the position of the gap 29 changes in accordance with the movement of the advancing apparatus 32 from the opening portion 28 to the stopper portion 27 of the device magazine 22. For example, referring to FIG. 4b, the gap 29 is shown in its left hand shifted position between $IC_2$ and $IC_3$.

Figure 4B:
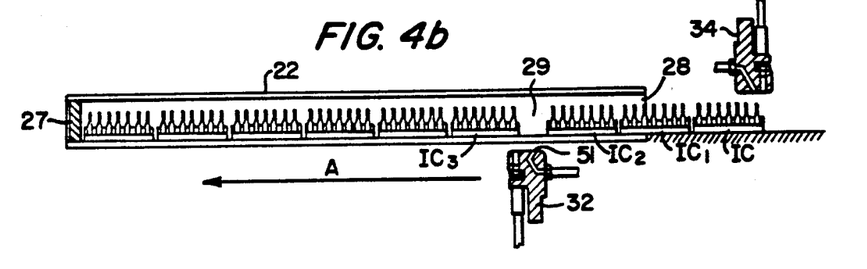
Figure 4C:
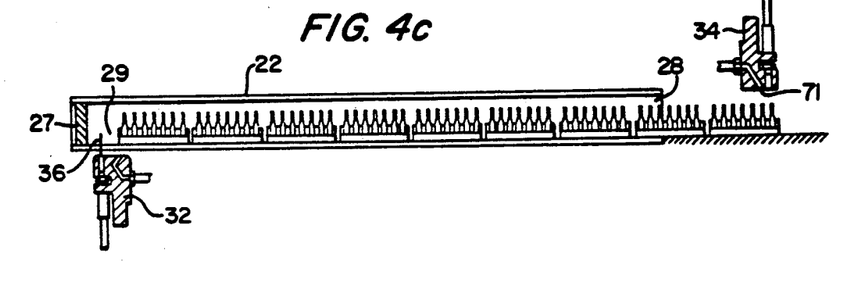

When the advancing apparatus 32 comes to the end of the magazine 22, as shown in FIG. 4c, the gap 29 also appears at the end of the magazine 22, i.e., between the stopper 27 and the last electronic device 20. The advancing apparatus 32 stops blowing air and inserts a piston pin 36 into the gap 29 through the slit 25 of the electronic device magazine 22. Thus, the purpose of continuously moving the advancing apparatus 32 from the opening portion 28 to the stopper portion 27 of the device magazine 22 while blowing air at the electronic devices 20 is to cause the gap 29 to appear at the end of the device magazine so that the piston pin 26 can be inserted therein.

Figure 4D:
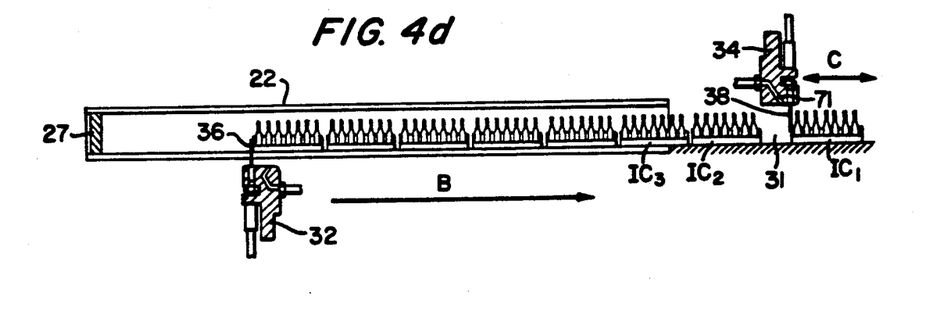

In FIG. 4d, the advancing apparatus 32 moves to the right hand direction (direction B in FIG. 4d) while pushing the electronic devices 20 with the piston pin 36. This time, the advancing apparatus 32 preferably moves in a step by step manner so that the electronic devices thus expelled from the device magazine can be separated and transferred one by one by the transfer apparatus 34. The transfer apparatus 34 blows air from an air nozzle 71 for a short period of time at $IC_1$ to cause a gap 31 between $IC_1$ and $IC_2$. Then the transfer apparatus 34 stops blowing air and inserts a piston pin 38 into the gap 31.

The transfer apparatus 34 transfers the first electronic device or $IC_1$ to a predetermined position to the right hand side by pushing the end of the electronic device with the piston pin 38. Preferably, within the period during which the transfer apparatus 34 transfers the electronic device to the right hand side and returns to its original position, the advancing apparatus 32 moves forward one step to the right hand side by a length of one electronic device. Then the advancing apparatus 32 stops during which time the transfer apparatus 34 transfers the next device and returns to make the gap 31.

Since the advancing apparatus 32 has stepped forward by the length of one electronic device, the second electronic device ($IC_2$) has been moved to the position where the first electronic device ($IC_1$) was before, i.e., that which is shown in FIG. 4d. The transfer apparatus 34 returns to its original position and blows air at the second electronic device to make the gap 31 between the second and third electronic devices in order to insert the piston pin 38 into the gap 31. Then the second electronic device is transferred to the predetermined position as in the same manner as the first electronic device. Thus, the transfer apparatus 34 reciprocates back and forth along a relatively short distance of travel as shown in the double headed arrow C in FIG. 4d.

This operation is repeated until all of the electronic devices 20 are taken out from the magazine 22. The emptied magazine is then replaced with another magazine having therein electronic devices to be tested. The advancing apparatus 32 starts blowing air at the electronic devices while continuously moving from the opening portion 28 to the stopper portion 27 to make the gap 29 at the end of the magazine 22 as described above.

The electronic devices thus taken out from the device magazine are separated from each other and moved in synchronism with the movement of the air drive devices 32 and 34 to the next stage of the device test system by, for example, a vacuum absorption hand (not shown).

Figure 5:
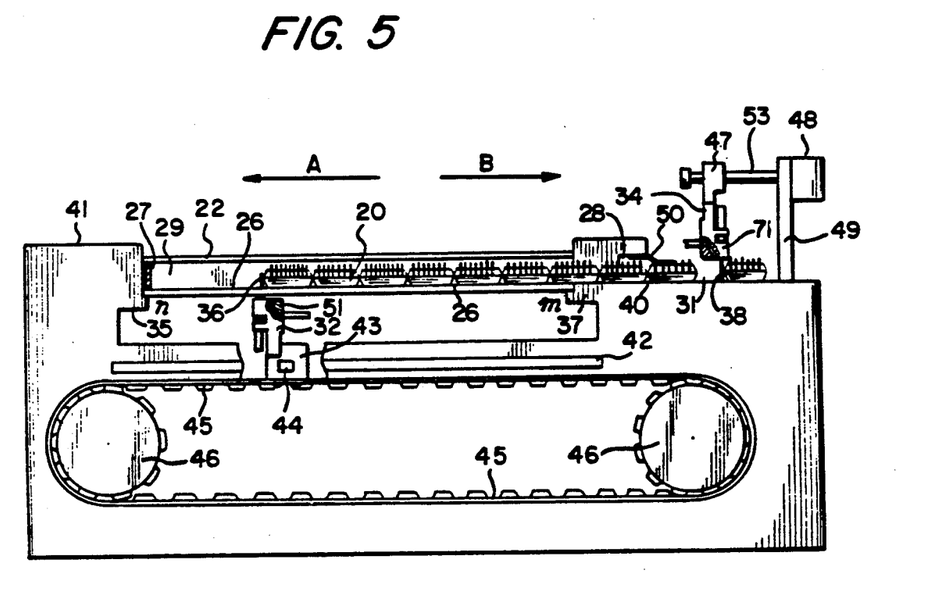
FIG. 5 is a simplified schematic view illustrating the separation and transfer apparatus of the present invention as embodied in a typical test system, and further illustrating the co-planar mounting of the magazine of the present invention.

FIG. 5 is a simplified schematic showing a side view of an embodiment of a separation and transfer apparatus manufactured in accordance with the present invention. The embodiment in FIG. 5 operates in the same manner as described in the schematic diagrams of FIG. 4. In FIG. 5, for simplicity of explanation, some parts (for example the electronic devices in a device magazine) are shown in transparent manner. In addition, elements shown in FIG. 5 which are the same as those shown in FIG. 4 bear the same reference numeral.

On a housing 41, a device magazine 22 having electronic devices 20 inside is mounted in a horizontal position. Magazine holders 35 and 37 hold the device magazine 22 until the electronic devices 20 are removed therefrom. The magazine holders 35 and 37 are constructed so that the inner surface of a floor 26 of the device magazine 22 and a surface 40 of the housing 41 are in the same plane. An advancing apparatus 32 is slidably mounted on the housing 41 through a guide 42. The advancing apparatus 32 is connected to a continuous belt 45 via a mounting member 43. The mounting member 43 includes a slide member 44 which projects into the guide 42 and slides through the guide 42 in a horizontal direction according to the movement of the continuous belt 45. The continuous belt 45 is connected to a pair of pulleys 46 which rotate either forward or backward (to the right or left in FIG. 5), as desired.

At least one of the pulleys 46 is connected to a drive mechanism, such as a step motor (not shown) so as to rotate in a continuous or step-by-step manner. A transfer apparatus 34 is provided in an up-side-down position with respect to the advancing apparatus 32 on the right side of the housing 41. The transfer apparatus 34 is mounted on a guide rail 53 through a mounting member 47 which moves slidably on the guide rail 53. The movement of the transfer apparatus 34 is controlled by a driver 48 mounted on a support 49 on the housing 41. The driver 48 is comprised of, for example, an air cylinder mechanism which drives the mounting member 47 between two predetermined positions by using a compressed air force. At the output or opening 28 of the electronic device magazine 22, there is provided a holder or spring plate 50 so that the electronic devices taken out from the magazine do not move freely on the surface 40 of the housing 41. As briefly disclosed with respect to FIG. 4, each of the air drive devices 32 and 34 has an air nozzle and a piston pin, respectively.

Still referring to FIG. 5, the operation of the device separation and transfer apparatus will be explained. After mounting the electronic device magazine 22 on the housing 41, the initial position of the advancing apparatus 32 is set to a position m, which is close to the opening portion 28 of the magazine 22. The advancing apparatus 32 starts blowing air from the air nozzle 51 at each of the electronic devices 20 through a slit 25 (FIG. 3) of the device magazine 22. While blowing the air at the electronic devices 20, the advancing apparatus 32 continuously moves in the direction A, from the position m to the position n, by the rotation of the pulley 46 along the guide 42.

By blowing air at the electronic devices 20, as described in reference to FIGS. 4a to 4c, the advancing apparatus 32 moves the electronic devices 20 one by one in the direction B and causes a gap 29 between the electronic devices 20. When the advancing apparatus 32 comes to the end of the magazine 22, the gap 29 is located at the end of the magazine 22, between the stopper 27 and the last electronic device 20. The advancing apparatus 32 stops blowing the air and inserts the piston pin 36 in the gap 29 through the slit 25 of the electronic device magazine 22. The piston pin can take on a variety of configurations, such as a planar plate device, in order to prevent entanglement with any leads on the electronic devices with which it may come in contact.

In accordance with a change of the rotation of the pulley 46, the advancing apparatus 32 moves in the direction B while pushing the electronic devices 20 with the piston pin 36. This time, the pulley 46, and thus the continuous belt 45, moves in a step-by-step manner so that the advancing apparatus 32 pushes the electronic devices by a distance equal to the length of one electronic device. The apparatus 32 then stops for a short time until one of the electronic devices is transferred by the transfer apparatus 34.

The transfer apparatus 34 blows air from an air nozzle 71 for a short period of time at the first electronic device which is free from the spring plate 50. As a result, a gap 31 is made between the first electronic device and the second electronic device. The second electronic device 20 is fixed on the surface 40 by the spring plate 50 attached to the housing 41. One of the purposes of the spring plate 50 is to prevent the second electronic device from moving while compressed air is blown from the nozzle 71 at the abutting area between the first and second electronic devices. Then the transfer apparatus 34 stops blowing compressed air and inserts a piston pin 38 into the gap 31.

The transfer apparatus 34 transfers the first electronic device to a predetermined suitable position at the right hand side by pushing the end of the electronic device with the piston pin 38. Preferably, within the period during which the transfer apparatus 34 transfers the electronic device to the right hand side and returns to its original position, the advancing apparatus 32 moves forward one step to the right hand side by a length of one electronic device. The transfer apparatus 34 returns to its original position and blows air at the second electronic device to make the gap 31 between the second and third electronic devices, thus permitting the piston pin 38 to be inserted into the gap 31. Then the second electronic device is transferred to the predetermined position, in the same way as the first electronic device, by the movement of the transfer apparatus 34.

This operation is repeated until all of the electronic devices 20 are expelled from the magazine 22. The emptied magazine is then replaced with another magazine having electronic devices to be tested therein. The advancing apparatus 32 starts blowing air at the electronic devices while continuously moving from the opening position to the stopper portion to make the gap 29 at the end of the magazine 22 as described above.

Although not shown, the embodiment of FIG. 5 also includes a controller which controls the total operation of the device separation and transfer apparatus, such as the timing and movement of the advancing and transfer apparatus 32 and 34, the timing of the air jets, the starting and stopping of the movement of the piston pins, and so forth. Also, the embodiment of FIG. 5 includes a compressed air source (not shown) to provide compressed air to the air driver devices 32 and 34 and also to the driver 48.

Figure 6:
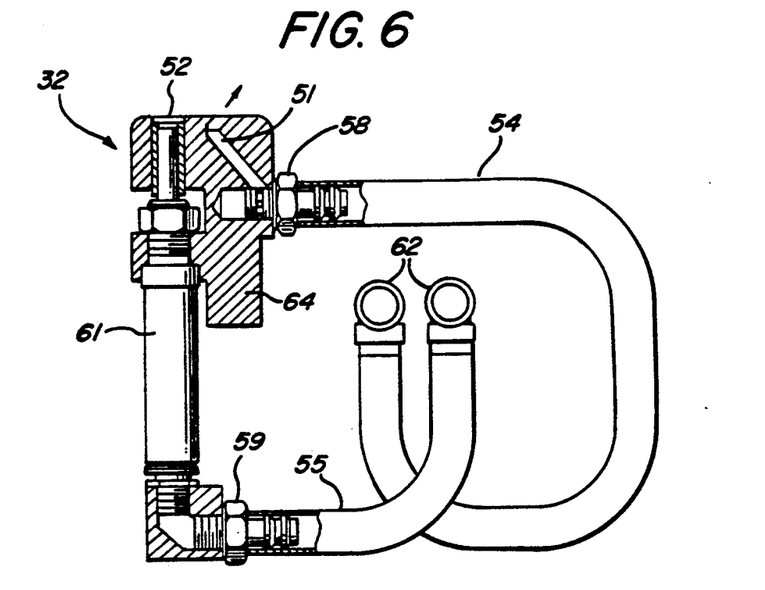
FIG. 6 is a schematic view illustrating an example of the advancing apparatus of the present invention.

FIG. 6 is a schematic view of the advancing apparatus 32 which remove the electronics devices from the device magazine 22, as explained above in connection with FIG. 5. As disclosed in FIGS. 4 and 5, the advancing apparatus 32 is positioned under an electronic device magazine so that it can blow compressed air and extend a pin through a slit in the magazine. On a housing 64 there are mounted an air connector 58 and an air cylinder 61. The air connector 58 is in fluid communication with an air nozzle 51 to provide compressed air from an air tube 54 to the nozzle 51. In the example of FIG. 6, the air nozzle 51 has a predetermined angle which blows compressed air at an upper-right diagonal direction. The diagonal angle of the nozzle 51 advantageously urges the electronic devices in the desired direction of travel. The angle may be preferably adjusted according to the configuration and weight of the particular IC on which it is acting. However, the angle shown will accomplish good results with a wide variety of IC configurations.

The air cylinder 61 includes a piston mechanism which pushes out a piston pin 36 (shown in FIGS. 4 and 5) from a hole 52 when the compressed air is supplied. A return spring (not shown) pulls back the piston pin 36 when the compressed air is not supplied. The air cylinder 61 is connected to an air connector 59 which provides the compressed air through an air tube 55. The air tubes 54 and 55 are connected to connectors 62 which provide compressed air from a compressed air source (not shown). The air cylinder 61 can be replaced by other means without utilizing the compressed air force, such as a mechanical structure which can push-out and pull-in the piston pin 36 disclosed in FIGS. 4 and 5 from the hole 52.

Figure 7:
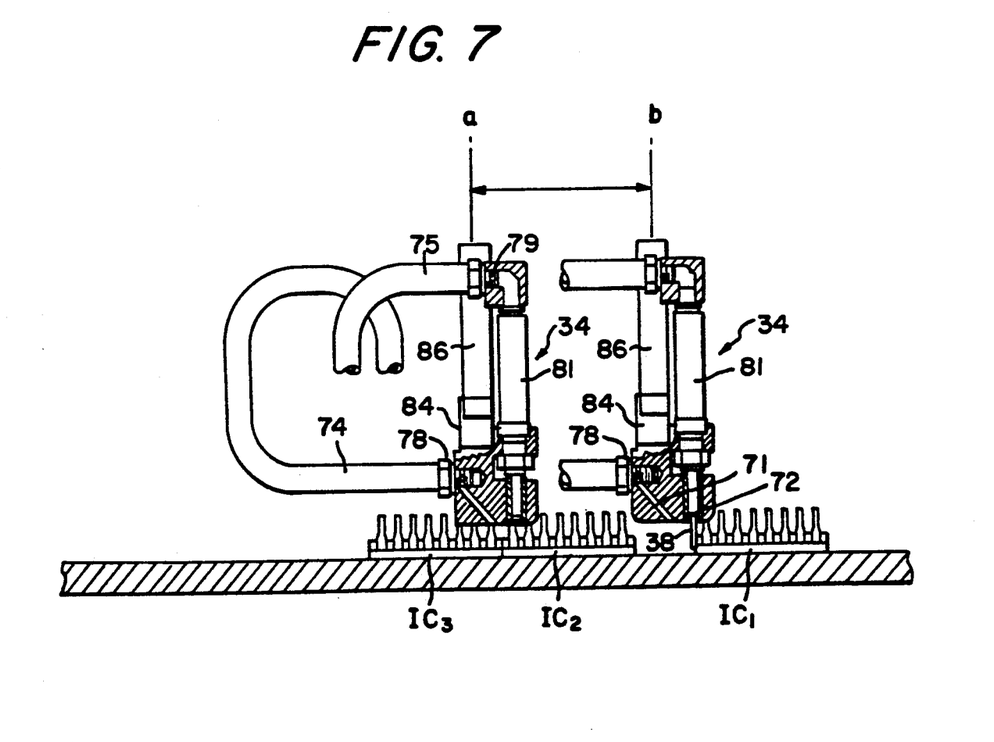
FIG. 7 is a schematic view illustrating an example of the air driven transfer apparatus of the present invention, and further illustrating its two positions between which it reciprocates while transferring electronic devices.

FIG. 7 is a schematic view of a transfer apparatus 34 for transferring the electronics devices from a device magazine in accordance with the present invention. FIG. 7 illustrates the transfer apparatus 34 in the two locations, a and b, between which the apparatus reciprocates during the transfer process. The structure of the transfer apparatus 34 is almost the same as that of the advancing apparatus 32 except that an air nozzle in the device 34 is angled in a different manner as nozzle 71. As disclosed in FIGS. 4 and 5, the transfer apparatus 34 is positioned over the electronic devices which are discharged from the device magazine 22 with its air nozzle and piston pin in a downward orientation.

Similar to the structure of FIG. 6, an air connector 78 and an air cylinder 81 are provided on a housing. The air connector 78 provides compressed air to an air nozzle 71. The air connector 78 is coupled to an air tube 74. In the example of FIG. 7, the air nozzle 71 has a predetermined angle which blows compressed air in a lower-right diagonal direction, to encourage movement of the ICs in this direction. The air cylinder 81 includes a piston mechanism (not shown) which pushes out a piston pin 38 (shown in FIGS. 4 and 5) from a hole 72 when the compressed air is supplied. The air cylinder 81 is connected to an air connector 79 which provides the compressed air through an air tube 75. The air tubes 74 and 75 are connected to a compressed air source (not shown) through other connectors. Again, the air cylinder 81 can be replaced by other means without utilizing a compressed air force, such as a mechanical structure which can push-in and pull out the piston pin 38 disclosed in FIGS. 4 and 5 from the hole 72.

The operation of the transfer apparatus 34 will be explained with reference to FIG. 7. By blowing compressed air for a short period of time from the air nozzle 71, the transfer apparatus 34 makes a gap between $IC_1$ and $IC_2$ which is sufficient to insert the piston pin 38 therein. The transfer apparatus 34 stops blowing compressed air and moves from position "a" to position "b" (FIG. 7) while transferring the $IC_1$ to the right hand side by the piston pin 38. The piston pin 38 is pulled back in the air cylinder 81 at the position "b" and the air drive device goes back to the position "a". At the position "a", the transfer apparatus 34 again provides compressed air to the end of the $IC_2$ to make a gap between $IC_2$ and the $IC_3$. This operation is repeated until all the electronic devices are transferred.

As has been described, in testing electronic devices, it is necessary to remove the electronic devices to be tested from the device magazine. FIGS. 8a-d are perspective views showing the outer shapes of various kinds of electronic devices and a cross sectional view of the corresponding magazines manufactured in accordance with the present invention.

In the invention illustrated in FIG. 8a-d, the same outer dimension of the device magazine is maintained without regard to the variation in size and shape of the electronic devices to be carried, so that the magazines are interchangeable without any change in the magazine holders 35 and 37 (FIG. 5). It is also important to keep the thickness of the floor of the magazines identical with each other among the different kinds of electronic devices so that the electronic devices can be slidably transferred from the device magazine to housing surface 40 of FIG. 5.

In the conventional device magazine, the outer shape and size varies depending on the kind of the electronic devices to be contained therein. If the outer size of the device magazine changes because of the need to test different kinds of electronic devices, that portion of the test system which automatically loads the device magazines also has to be changed to accommodate the magazines dimensions, thus resulting in a loss of time and increasing the cost. For example, in the separation and transfer apparatus of the present invention, shown in FIG. 5, the magazines holders 35 and 37 on the housing 41 which hold the device magazine 22 would have to be changed if the size of the magazine 22 varies.

Figure 8A:
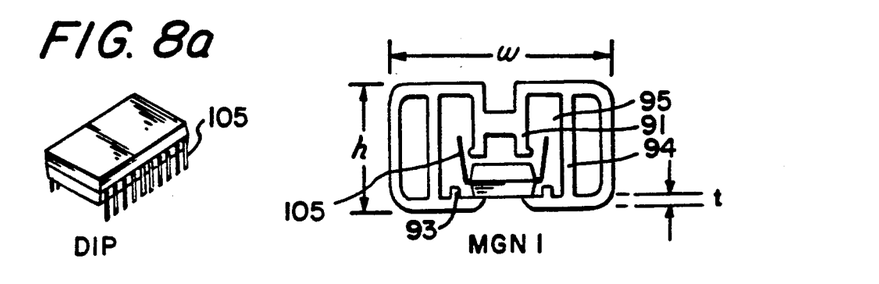
FIGS. 8a–8d are perspective views of various kinds of electronic devices and corresponding cross-sectional views of the universal magazine of the present invention as such devices would appear therein.

FIG. 8a shows a perspective view of an IC package called a dual-in-line package (DIP) and a cross sectional view of the corresponding magazine (MGN1). Since the electric leads 105 of the DIP are relatively long and straight, the MGN1 has a space 95 defined by side walls 94 and a ceiling 91. The MGN1 also includes guides 93 to limit the free movement of the DIP ICs in the transverse direction. The MGN1 has outer dimensions, including a width w, height h, and bottom thickness t, which are suitable for co-planar mounting in a magazine holding part of the device separation and transfer apparatus of FIG. 5. It will also be noted that each magazine has a slit 25.

Figure 8B:
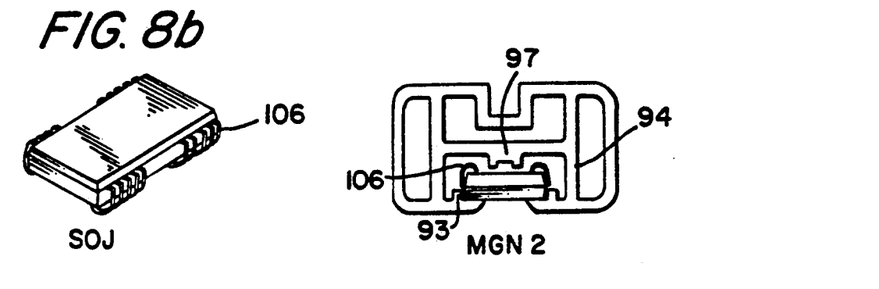

FIG. 8b shows a perspective view of an IC package called a small-outline-J-lead (SOJ) and a cross sectional view of the corresponding magazine (MGN2). Since the SOJ package IC has J-shaped leads 106 which are relatively short and curved, the MGN2 for carrying the SOJ ICs has an inner shape which is different from MGN1, in that a ceiling 97 is lowered. To limit the free movement of the SOJ ICs, the MGN2 also includes walls 94 and guides 93. Although the inner size and shape of the MGN2 is different from the MGN1, the outer dimensions, including the bottom thickness t, are identical to one another.

Figure 8C:
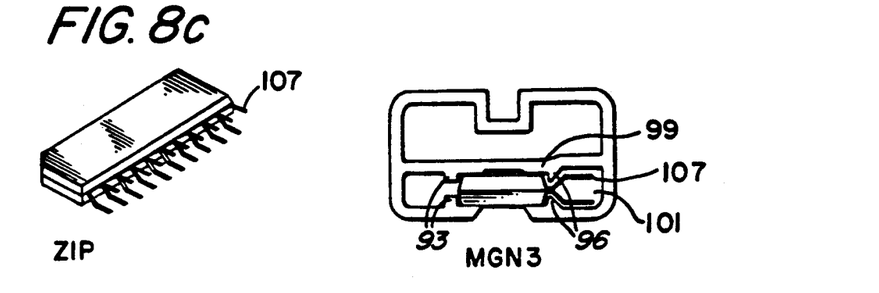

FIG. 8c shows a perspective view of an IC package called a zigzag-in-line-package (ZIP) and a cross sectional view of the corresponding magazine (MGN3). Since the ZIP IC has zigzag leads 107 on one side of the package, the MGN3 for storing the ZIP ICs has a different inner shape from the MGN1 or the MGN2 in that a ceiling 99 also includes guides 93 and 96 to limit the free movement of the ZIP ICs. To provide a space for the zigzag leads 107, the side walls 94 in FIGS. 8a and 8b are not used. Again, the outer dimensions, including the bottom thickness of the MGN3, are identical to that of the MGN1 and MGN2.

Figure 8D:
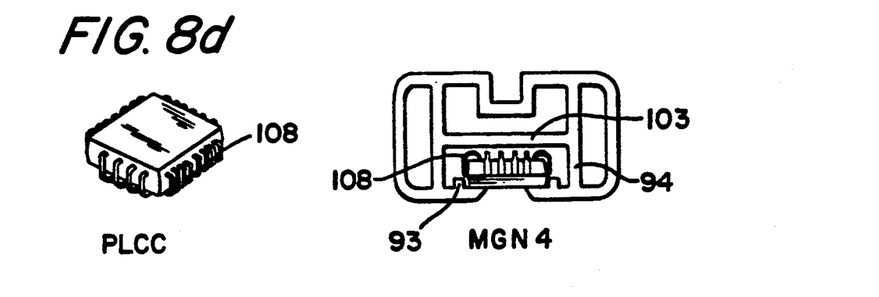

FIG. 8d shows a perspective view of an IC package called a plastic-chip-carrier (PLCC) and a cross sectional view of the corresponding magazine (MGN4). Since the PLCC IC has J-shaped leads 108 on all sides of the package, the MGN3 for storing the ZIP ICs has a different ceiling 103 which does not have a projecting part so as to not touch the leads 108. The MGN4 also includes guides 93 and side walls 94 to limit the free movement of the PLCC ICs. Again, the outer dimensions, including the bottom thickness of the MGN3, are identical to that of the MGN1, MGN2 and MGN3.

As described above, the electronic device magazines of the present invention commonly employ the same outer size, i.e., height, width, length and bottom thickness, even though they carry different types and shapes of electronic devices inside. Therefore, the magazines for the various kinds of electronic devices can be used in the separation and transfer apparatus of the present invention without changing magazines or the magazine holder of the apparatus.

Although the invention has been described in terms of the preferred embodiment, other embodiments that are apparent to those of ordinary skill in the art are also within the scope of the invention. Accordingly, the scope of the invention is intended to be defined only by reference to the appended claims.

What is claimed is:

1. A separation and transfer apparatus for use in connection with an electronic device test system for removing electronic devices from a device magazine and transferring said electronic devices in horizontal direction, comprising:
   a housing which holds said device magazine in a predetermined position, said housing includes a plate having a same plane as that of an inner floor of said device magazine;
   an air blower which blows compressed air at said electronic devices through a slit of said device magazine so that said electronic devices move in one direction on a horizontal plane, said air blower continuously moves from one end of said device magazine to the other end of said device magazine while blowing said compressed air;
   a piston pin which ejects a pin and inserts said pin into a space made between a last electronic device in said device magazine and said other end of said device magazine, said piston pin pushes an end of said last electronic device so that said electronic devices are taken out from said device magazine; and
   a driver which is connected with said air blower and said piston pin so as to change a horizontal position of said air blower and said piston pin.

2. A separation and transfer apparatus as defined in claim 1, wherein said driver comprises a continuous belt and a pair of pulleys.

3. A separation and transfer apparatus for use in connection with an electronic device test system for taking out electronic devices from a device magazine and transferring said electronic devices in horizontal direction, comprising:
   a housing which holds said device magazine in a predetermined position, said housing includes a plate having a same plane as that of an inner floor of said device magazine;
   a first air blower which blows compressed air to said electronic devices through a slit of said device magazine so that said electronic devices move in one direction on a horizontal plane, said air blower continuously moves from one end of said device magazine to the other end of said device magazine while blowing said compressed air;

a first piston pin which ejects a pin and inserts said pin into a space made between a last electronic device in said device magazine and said other end of said device magazine, said piston pin pushes an end of said last electronic device so that said electronic devices are taken out from said device magazine;

a first driver which is connected with said first air blower and said first piston pin so as to change a horizontal position of said first air blower and said first piston pin;

a second air blower which blows compressed air to said electronic devices ejected from said device magazine so as to cause a space between a first electronic device and a second electronic device;

a second piston pin which ejects a pin and inserts said pin into said space made between the first electronic device and said second electronic device, said piston pin pushes an end of said first electronic device so that said first electronic device is transferred to a predetermined position;

a second driver which is connected with said second air blower and said second piston pin so as to change a horizontal position of said second air blower and said second piston pin.

4. A device separation and transfer apparatus as defined in claim 3 further including means for stopping a second electronic device taken out from device magazine on a predetermined position on said housing.

5. A device separation and transfer apparatus as defined in claim 3, wherein said first driver comprises a continuous belt and a pair of pulley, and said second driver comprises a drive mechanism using compressed air force.

6. A device separation and transfer apparatus as defined in claims 1 or 3, wherein said piston pins are driven by compressed air force through air cylinders.

7. A device separation and transfer apparatus as defined in claims 1 or 3, wherein said air blowers include air nozzles which have predetermined angle against said electronic devices so that said compressed air from said air nozzles effectively cause spaces between said electronic devices.

8. A device separation and transfer apparatus as defined in claim 1, wherein said air blower and said piston pin integrally constitute an air drive device.

9. A device separation and transfer apparatus as defined in claim 3, wherein said first air blower and said first piston pin integrally constitute a first air drive device, and said second air blower and said second piston pin integrally constitute a second air drive device.

10. A device separation and transfer apparatus as defined in claim 9, wherein said first air drive device and said second air drive device are positioned in opposite direction with each other.

11. A method of separating electronic devices from an electronic device magazine and transferring said electronic devices in horizontal direction in a device separation and transfer apparatus, comprising the steps of:

holding said device magazine in a predetermined position of a housing of said device separation and transfer apparatus;

blowing compressed air to said electronic devices through a slit of said device magazine so that said electronic devices move to predetermined direction on a horizontal plane so as to cause a space between said electronic devices, while continuously changing a blowing position for blowing said compressed air from one end of said device magazine to the other end of said device magazine;

inserting a piston pin into said space made between a last electronic device in said device magazine and said other end of said device magazine;

pushing an end of said last electronic device step by step so that said electronic devices are taken out from an outlet of said device magazine.

12. A method of separating electronic devices from an electronic device magazine and transferring said electronic devices in horizontal direction in a device separation and transfer apparatus, comprising the steps of:

holding said device magazine in a predetermined position of a housing of said device separation and transfer apparatus;

blowing compressed air to said electronic devices through a slit of said device magazine so that said electronic devices move in a predetermined direction on a horizontal plane so as to cause a space between said electronic devices, while continuously changing a blowing position for blowing said compressed air from one end of said device magazine to the other end of said device magazine;

inserting a piston pin into said space made between a last electronic device in said device magazine and said other end of said device magazine;

pushing an end of said last electronic device step by step so that said electronic devices are taken out from an outlet of said device magazine;

blowing compressed air to a first device of said electronic devices taken out from said device magazine for a short period of time so as to cause a space between said first and second electronic devices;

inserting a piston pin into said space made between said first and second electronic devices and transferring said first electronic device to a predetermined position.

* * * * *